United States Patent [19]

Martinez

[11] 4,283,739
[45] Aug. 11, 1981

[54] COLOR TELEVISION RECEIVERS

[75] Inventor: Anthony Martinez, Bedford, England

[73] Assignee: Texas Instruments Incorporated, Dallas, Tex.

[21] Appl. No.: 70,755

[22] Filed: Aug. 30, 1979

[30] Foreign Application Priority Data

Sep. 11, 1978 [GB] United Kingdom ............... 36341/78

[51] Int. Cl.³ .............................................. H04N 9/50
[52] U.S. Cl. .................................. 358/24; 358/21 R; 358/23
[58] Field of Search ................... 358/21 R, 23, 24, 25, 358/17, 19, 31, 40, 188

Primary Examiner—Robert L. Richardson
Assistant Examiner—Michael A. Masinick
Attorney, Agent, or Firm—Melvin Sharp; N. Rhys Merrett; Gary C. Honeycutt

[57] ABSTRACT

In a color television receiver, especially for NTSC or PAL color television signals, the intermediate frequency is a phase-lock integral multiple of the sub-carrier frequency. Preferably the intermediate frequency is 4N times the sub-carrier frequency, where N is an integer. The receiver may include a crystal controlled oscillator phase locked to a multiple of the color burst frequency, the oscillations from the oscillator compared with the intermediate frequency and the result of the comparison used to control the frequency of a local oscillator. The oscillations from the crystal controlled oscillator may be used directly for synchronous demodulation of the intermediate frequency signal to give a Y or Y-chroma signal and after addition of a signal of sub-carrier frequency and suitable phase adjustment for synchronous demodulation to give U- and V- signals. Alternatively, the crystal oscillator oscillation and a signal of sub-carrier frequency derived from it may be used separately to give the U- and V- signals.

18 Claims, 3 Drawing Figures

COLOR TELEVISION RECEIVERS

This invention relates to colour television receivers and is applicable to the reception of colour television signals in which the colour information is carried by a sub-carrier, such as the PAL and NTSC system signals.

In the PAL system the signal consists of a luminance component transmitted as a baseband signal together with line and frame synchronising pulses with red and blue colour difference signals transmitted as amplitude modulation of orthogonal phases to a sub-carrier signal, the phase of the red colour difference signal being switched through 180° in alternate lines. To facilitate the decoding, a colour burst consisting of a few cycles of the sub-carrier oscillation at a reference phase is transmitted during each line flyback interval. With a signal of such complexity it is inevitable that the receiver is relatively complex and that the phase shifting effects of frequency sensitive filters used to separate and process the components of the signal adversely affect the quality of reproduction.

It is an object of the present invention to provide an improved colour television receiver.

According to the present invention there is provided a receiver for colour television signals of the kind in which colour information is carried as phase dependent modulation of a sub-carrier, the receiver including means for converting a received signal to an intermediate frequency and means for synchronously demodulating the intermediate frequency signal to produce luminance and chrominance information, wherein the intermediate frequency is a phase locked integral multiple of the sub-carrier frequency.

Preferably the intermediate frequency is 4 N times the sub-carrier frequency, where N is an integer. In a particular example of the invention the intermediate frequency is 35,46195 MHz, the sub-carrier frequency being 4.43362875 MHz, that is the standard frequency for a U.K. PAL television signal.

The selection of the intermediate frequency to be a phase locked integral multiple of the sub-carrier frequency brings advantages in the decoding of the received signal and in particular enables the signal processing to be performed without the use of frequency-dependent filters.

The receiver may include a crystal controlled oscillator phase locked to a multiple of the sub-carrier frequency as represented by a reference signal, such as a colour burst, derived from the received signal. The oscillations from the crystal controlled oscillator may be compared with the intermediate frequency signal in a phase detector and the resultant error signal applied to adjust the frequency of a local oscillator which is used to derive the IF signal from a received signal by means of a radio frequency mixer.

In order that the invention may be fully understood and readily carried into effect it will now be described with reference to the accompanying drawings, of which:

Figure 1:
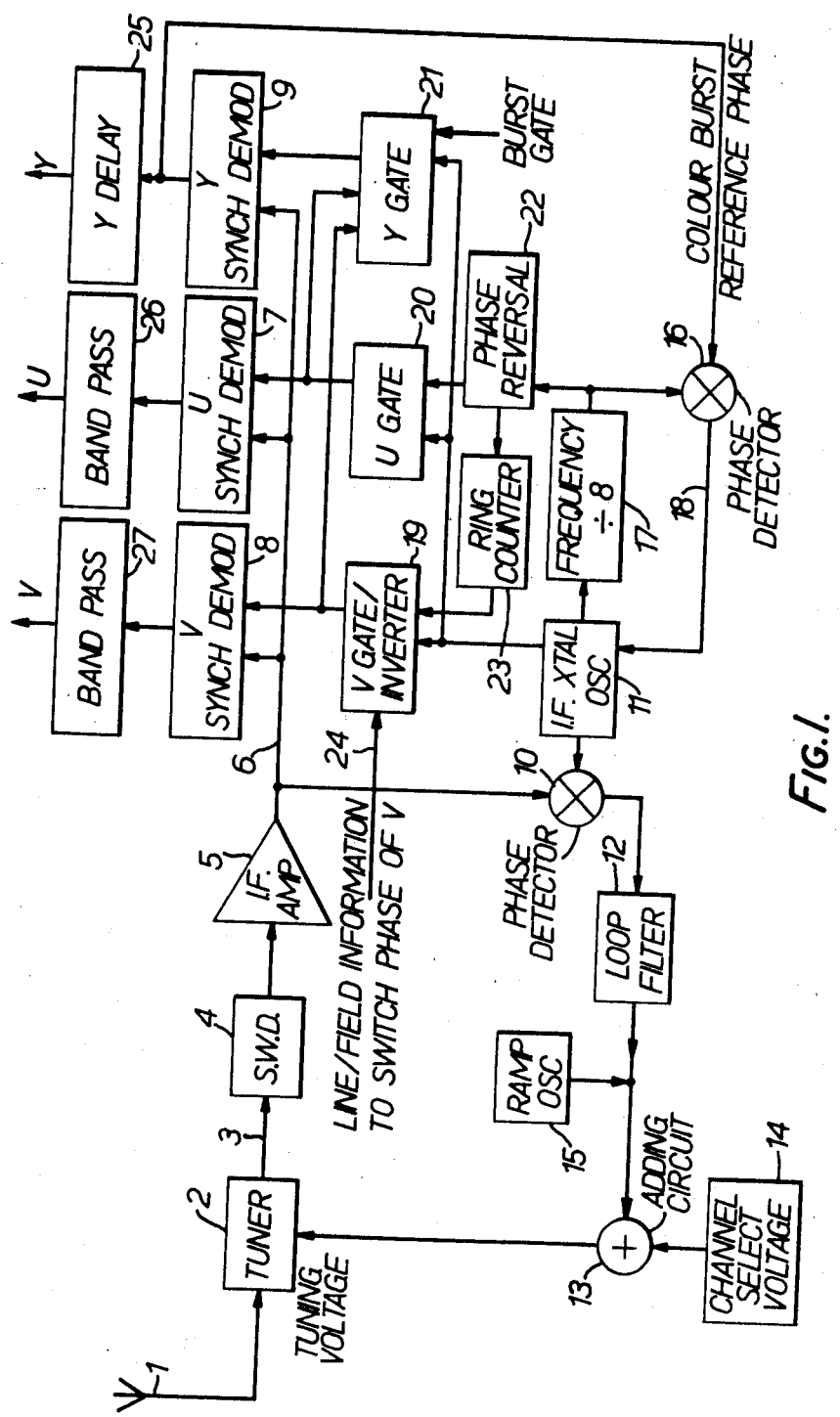
FIG. 1 is a block diagram of part of a colour television receiver according to an example of the present invention showing the derivation of U, V and Y signals from a received PAL television signal.

Referring now to FIG. 1 of the drawings, the block diagram shows the circuitry used to derive the U, V and Y signals from a PAL colour television signal. In order to complete the receiver there will also be required a display tube, line and field scanning circuits together with the means for synchronising the circuits with the received signal, the sound reception and reproduction means and the necessary controls and power supplies; these are not shown in FIG. 1.

The PAL signal is received by an aerial 1 and applied to a tuner 2 where the received radio frequency signal is converted to an intermediate frequency signal which appears on a conductor 3. The tuner 2 will include a varactor tuned local oscillator, the oscillations from which are mixed with the received signal to produce the intermediate frequency signal. A surface wave device 4 acting as an intermediate frequency signal filter receives the intermediate frequency signal and transmits it to an intermediate frequency amplifier 5. The amplified intermediate frequency signal appears on conductor 6 and, in addition to being applied to the U, V and Y signal synchronous demodulators 7, 8 and 9, is applied to a phase detector 10 in which the phase of the intermediate frequency signal is compared with the phase of the oscillation produced by an intermediate frequency crystal oscillator 11. The phase difference signal from the detector 10 is applied via a loop stabilising filter 12 to an adding circuit 13, where it is added to the output voltage of a channel selector 14 and applied as a tuning voltage to the tuner 2. A low frequency ramp signal is applied to the output voltage from the filter 12 by a ramp oscillator 15; the function of the oscillator 15 will be described later.

A reference signal of the frequency of the colour sub-carrier and of a reference phase is derived from the Y signal synchronous demodulator 9 and applied to a second phase detector 16, where it is compared with the oscillation from the intermediate frequency crystal oscillator 11 after division in frequency by eight by a frequency divider 17. The phase error output signal from the detector 16 appears on a conductor 18 and is applied to control the frequency of the oscillation which it produces, so that it is phase locked to an integral multiple of the colour sub-carrier signal.

It will be apparent that the circuitry thus far described enables the intermediate frequency oscillator 11 to be phase locked to eight times the received colour sub-carrier signal and, by virtue of the loop connecting the output of the amplifier 5 back to apply a tuning voltage to the tuner 2, enables the intermediate frequency signal derived from the received PAL colour television signal to be locked to the same multiple of the colour sub-carrier. The channel selector 14 which may take any convenient form is arranged to provide a steady voltage which closely corresponds to the voltage required to cause the local oscillator in the tuner 2 to convert the received signal to the correct intermediate frequency output. In practice it is found that the accuracy within which this voltage can be set is limited to producing an intermediate frequency signal within perhaps 1 MHz of the required value and it is likely that the capture range of the loop is too small to enable the intermediate frequency to be locked to the required frequency. In order to overcome this difficulty the ramp oscillator 15 is provided which produces a relatively slow ramp occupying, for example, about one second which swings the voltage so that the local oscillator frequency varies over a range of about 2 MHz.

When locking occurs a zero output signal at the output of the filter 12 is used to turn off the ramp oscillator.

The intermediate frequency reference signal from the oscillator 11 is applied to three gates 19, 20 and 21, which are respectively used to produce the switching signals for the demodulators 8, 7 and 9. The frequency divided output of the oscillator 11 which appears from the frequency divider 17 is applied to the gate 20 via a phase reversing circuit 22 and also from the circuit 22 via a ring counter 23 an output is applied to the gate 19. The outputs of the gates 19 and 20 in addition to being applied to the demodulators 8 and 7 are applied as inputs to the gate 21. Because of the phase alternation of the V signals, the line and field information derived from the scanning circuits is applied via a conductor 24 to the gate 19 to ensure the correct selection of the sampling signal for the V signal synchronous demodulator 8.

The gate 20 which is used to provide the sampling signal for the U signal synchronous demodulator 7 receives as its inputs only the intermediate frequency reference signal from the oscillator 11 which is needed for the synchronous demodulation of the signal on the conductor 6 and also a signal of colour sub-carrier frequency which appears at the output of the frequency divider 17. The phase reversing circuit 22 is needed to correct the phase of the colour sub-carrier oscillation applied to the gate 20 so that it is correct for the generation of the sampling pulse or the synchronous demodulation of the U signal.

The circuit 19 which produces the sampling signal for synchronous demodulation of the V signal also includes an inverter responsive to the line and field information because of the necessity to alternate the phase selected by the sampling pulses with alternate lines. The circuit 19 is like the circuit 20 and receives the IF reference oscillation from the oscillator 11 and the colour sub-carrier frequency from the output of the divider 17. The ring counter 23 is provided to produce outputs corresponding to the two phases of the colour sub-carrier which are orthogonal to the phase from the circuit 22, these two phases being required to demodulate the V signal.

The gates 19 and 20 generate the sampling waveforms for the U and V signal synchronous demodulators 8 and 7. The sampling pulses are coincident with the peak amplitudes of the V and U components in the combined intermediate frequency on the conductor 6. The Y signal synchronous demodulator 9 receives sampling pulses from the gate 21 when both the U and V sampling signals are zero and therefore this gate receives the outputs of the gates 19 and 20 and also the intermediate frequency reference oscillations from the oscillator 11. A delay circuit 25, which may be a surface wave device, is connected to the output of the Y signal synchronous demodulator 9 to correct the phasing of the signal with reference to the U and V signals. The bandpass filters 26 and 27 are connected to the outputs of the U and V signal synchronous demodulators 7 and 8 respectively to restrict the band-widths of the U and V signals and thereby reduce high frequency noise in the signals.

The U, V and Y signals would be matrixed together to produce the three colour difference signals for application to the grids of the three guns of a colour CRT, for example, and the Y signal would be applied to the cathode of this tube in the usual way.

Figure 2:
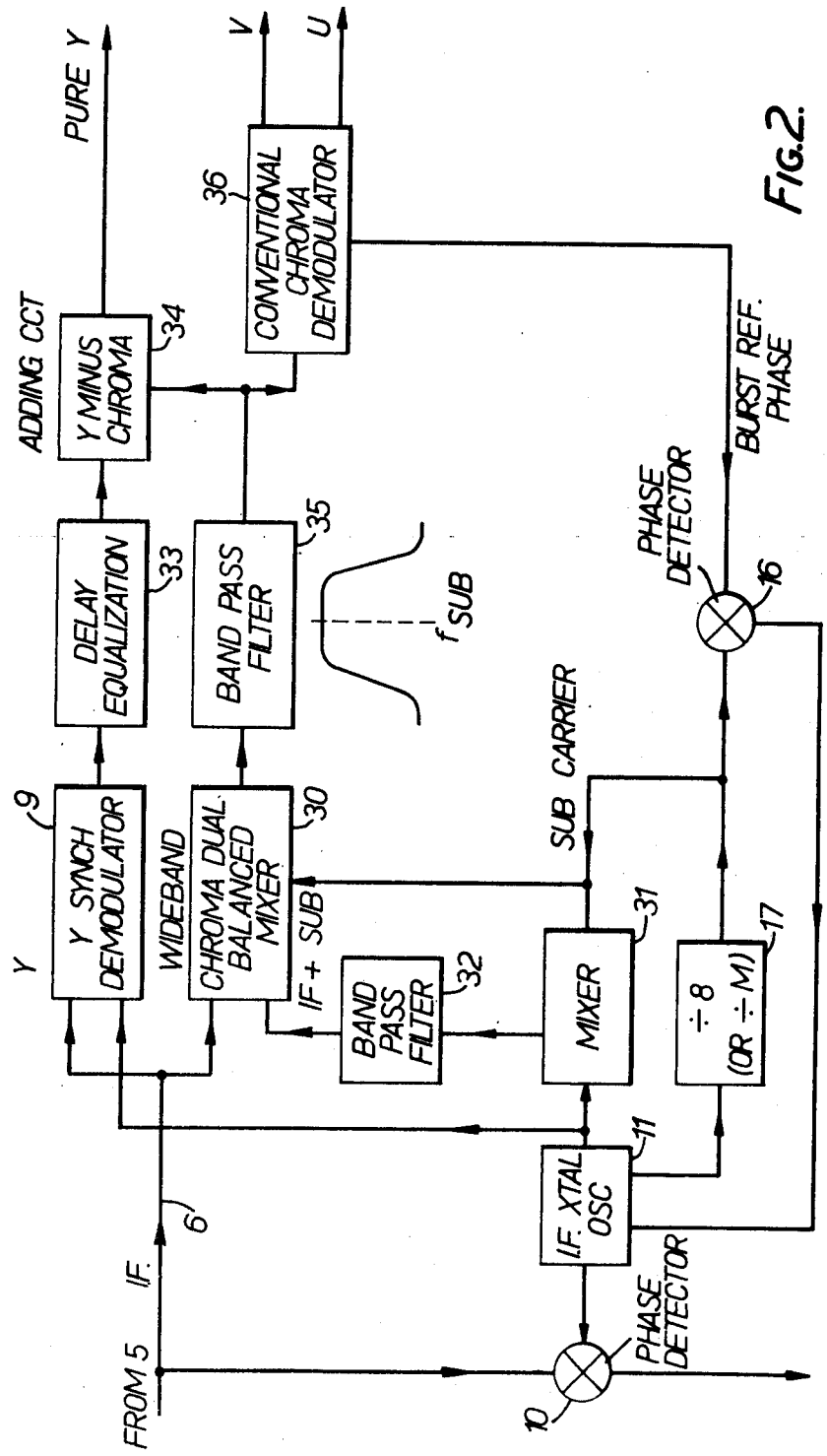
FIG. 2 shows in block diagrammatic form a modification of part of the circuit shown in FIG. 1.

FIG. 2 shows alternative signal processing circuitry and the connections to components of FIG. 1 and components of FIG. 2 which correspond to those shown in FIG. 1 are indicated using the references used in FIG. 1. In FIG. 2 the conductor 6 is connected to a Y signal synchronous demodulator 9 as in FIG. 1, but the U and V signal synchronous demodulators are replaced by a wide band chroma balanced mixer 30 in which the chroma signals in the intermediate frequency signal on the conductor 6 are mixed with a reference signal of frequency equal to the intermediate frequency plus the sub-carrier frequency which may, for example, be nine times the sub-carrier frequency. This signal is derived from a mixer 31 having as inputs the output of the oscillator 11 and the output of the frequency divider 17, via a bandpass filter 32 which selects the higher frequency sum signal from the mixer 31. The output of the Y signal synchronous demodulator 9 is applied via a delay circuit 33 which serves to equalise the phases of the Y signal and the chroma signals and the delayed signal is applied to an adding circuit 34. The lower frequency output of the mixer 30 is selected by a bandpass filter 35 having a central frequency equal to the colour sub-carrier frequency. The filter output is applied as a second input to the adding circuit 34 so as to re-introduce the chroma components into the signal derived from the Y signal synchronous demodulator so that the output of the circuit 34 is the Y signal. The output of the filter 35 is also applied to a conventional chroma demodulator circuit 36 from which the U and V signals are derived in well-known manner. The colour sub-carrier reference oscillation is also derived by this demodulator for the purposes of demodulation and is used as the reference phase for the phase detector 16.

Figure 3:
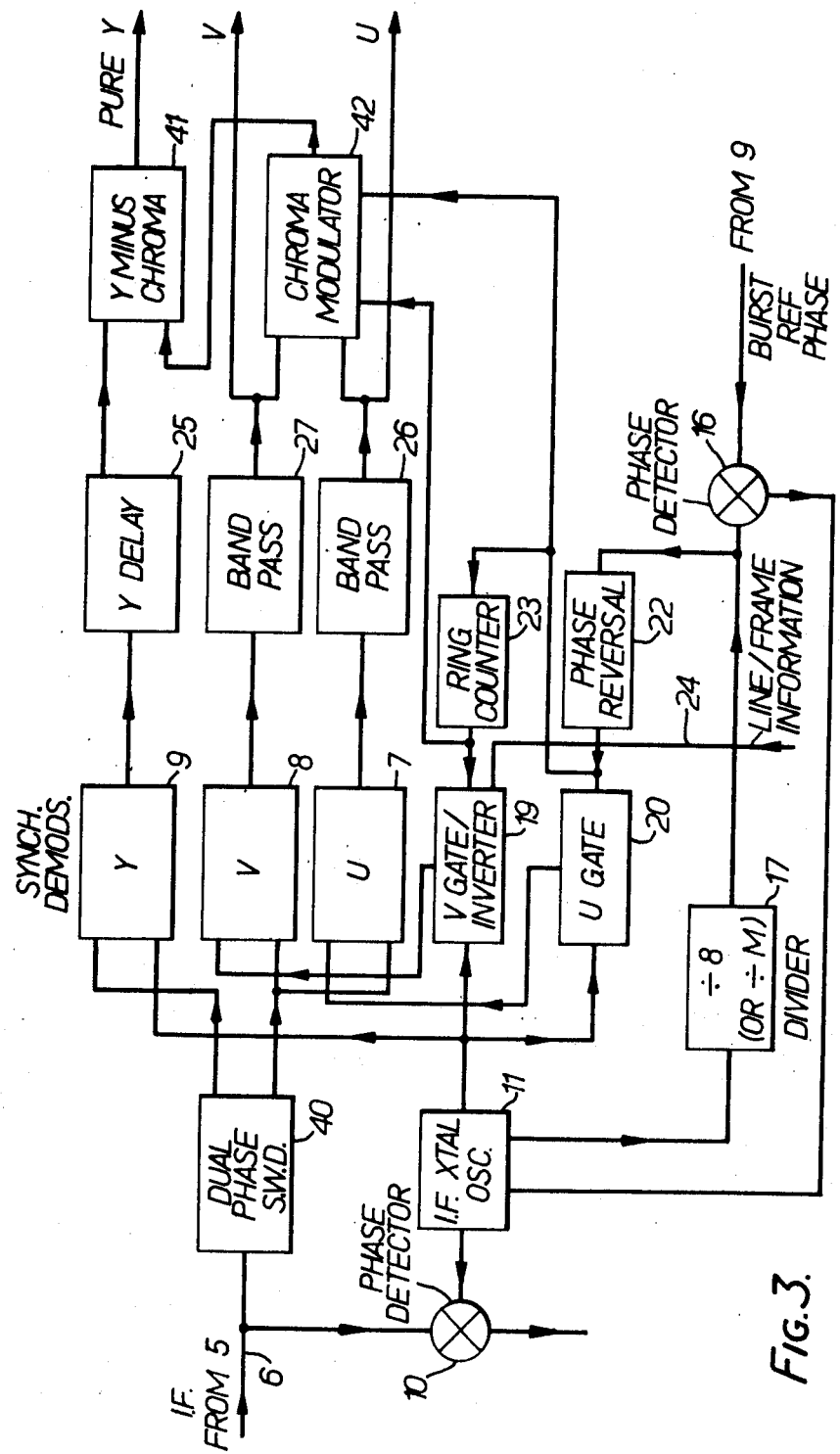
FIG. 3 shows a further example of the signal processing circuits of FIG. 1.

FIG. 3 shows another alternative method of processing the signal components derived from the intermediate frequency signal. As in FIG. 2 the connections to components of FIG. 1 and components for fulfilling the same functions as in FIG. 1 are indicated using the same reference numbers as in that Figure. The circuit of FIG. 3 is similar to the circuit shown in FIG. 1 in that the colour sub-carrier reference oscillation derived from the output of the frequency divider 17 is applied via a phase reversal circuit 22 to a gate 20 generating a sampling waveform for the U signal synchronous demodulator 7. The output of the phase reversal circuit 22 is also used after passing through a ring counter 23 to drive a gate 19 producing a V signal sampling waveform for the V signal synchronous demodulator 8. However, the inputs to the synchronous demodulators 7, 8 and 9 are derived from the conductor 6 via a dual phase surface wave device 40, one output of which is applied to the Y signal demodulator 9 and the other output of which is applied to the U and V signal demodulators 7 and 8. The purpose of the surface wave device 40 is to provide the appropriate delay equalisation of the Y signal relative to the U and V signals and of both of these relative to the intermediate frequency reference oscillation produced by the oscillator 11. The U and V signals are derived from the outputs of the bandpass filter circuits 26 and 27 in exactly the same way as in FIG. 1. However, because the U and V signal sampling waveforms are not used to provide a Y signal sampling waveform as in FIG. 1, the output of the Y signal synchronous demodulator 9 is Y minus the chroma signals and these must be re-introduced. This is achieved by means of an adding circuit 41 to which is applied the output of the Y signal equalizing delay 25 and the combined U and V signals remodulated on the appropriate phases of the colour sub-carrier derived from the outputs of the phase reversal circuit 22 and the ring counter 23 respectively in a modulator 42.

Although the examples of the invention described above are receivers for a PAL colour television signal, they could easily be adapted for the reception of any colour television signal in which the colour information is transmitted as modulation of a sub-carrier such as, for example, the NTSC system. In order to adapt the embodiments of the invention described above for the reception of an NTSC signal having 525 lines per frame and 60 fields per second, the suggested intermediate frequency should be changed to 28.63636 MHz which is 8 times the colour sub-carrier frequency of 3.579545 MHz of such a signal. In addition, since the NTSC system does not incorporate a phase switched colour component as is provided in the PAL system, the inverters indicated as being included in the blocks 19 shown in FIGS. 1 and 3 would be omitted and in addition the input connection 24 for the signal controlling the inverter would also be omitted. Apart from these minor changes it will be apparent from consideration of the foregoing description that the invention is equally applicable to the reception of an NTSC system colour signal.

The intermediate frequency chosen in the above examples is eight times the colour sub-carrier frequency, but it is to be understood that other multiples could be used although preferably the multiples are of the form 4 N where N is an integer. It will be appreciated that the phase lock system described above establishes two correlations (a) the locking of the intermediate frequency to a colour sub-carrier signal of reference phase and (b) the locking of the intermediate frequency sampling pulses used in the synchronous demodulators to the chroma signals. A flat amplitude response surface wave filter may be used to provide the delays required between the luma and the chroma signals so that after synchronous demodulation a simple comb filter matrix also provided by a surface wave device can be used to derive the Y, U and V signals. The sampling waveforms used for the synchronous demodulation of the intermediate frequency, which is locked to the colour sub-carrier can be derived from the line and field scanning signals, bearing in mind that the colour sub-carrier is chosen to have a particular relationship to these components. The synchronous demodulators, frequency dividers and sampling logic could be formed as one or more integrated circuits using emitter coupled logic and linear technology. The comb filter matrix could be integrated with the above circuits so that the bandpass and lowpass filters required could be incorporated in the same circuits. It is believed that a system such as that described above could give colour pictures of comparable performance to RGB monitors free from cross colour disturbances.

What we claim is:

1. A receiver for colour television signals of the kind in which colour information is carried as phase dependent modulation of a sub-carrier, the receiver including means for converting a received video signal to an intermediate frequency which is a phase locked integral multiple of the sub-carrier frequency; and means for synchronously demodulating the intermediate frequency signal to produce luminance and chrominance information.

2. A receiver according to claim 1, wherein the intermediate frequency is 4 N times the sub-carrier frequency, where N is an integer.

3. A receiver according to claim 2, wherein the intermediate frequency is 35.46895 MHz and the sub-carrier frequency is 4.43361875 MHz.

4. A receiver according to claim 1, wherein the intermediate frequency is 28.63636 MHz and the sub-carrier frequency is 3.579545 MHz.

5. A receiver for colour television signals of the kind in which colour information is carried as phased dependent modulation of a sub-carrier signal, the receiver including a local oscillator, means for mixing a received video signal with a signal generated by said local oscillator to produce an intermediate frequency signal having a frequency which is a phase-locked integral multiple of said sub-carrier frequency; crystal controlled oscillator means; means for locking the crystal controlled oscillator means to a multiple of the sub-carrier frequency; phase comparator means for comparing the output signal frequency of the crystal controlled oscillator means with said intermediate frequency signal; and means responsive to an output signal from said comparator means for adjusting the frequency or phase of said local oscillator output signal in a sense to bring the intermediate frequency signal into said phase-locked relation with the output signal of said crystal controlled oscillator means.

6. A receiver according to claim 5, wherein the means for phase-locking the crystal oscillator is responsive to a colour burst signal derived from the received signal.

7. A receiver according to claim 5, wherein the local oscillator is a varactor tuned oscillator.

8. A receiver according to claim 7, including means for applying preset voltages to a varactor of the local oscillator to effect channel selection.

9. A receiver according to claim 8, including means for generating a slowly varying voltage ramp which is added to the preset voltages to widen the capture range of the local oscillator frequency control.

10. A receiver according to claim 5, including synchronous demodulator means for receiving said crystal controlled oscillator signal producing a Y or Y-chroma signal.

11. A receiver according to claim 10, including means for combining said crystal controlled oscillator signal and a signal of sub-carrier frequency and means for utilizing said combined signal and said intermediate frequency signal to produce U- and V- signals.

12. A receiver according to claim 10, including demodulator means for utilizing the crystal oscillator signal and a signal of sub-carrier frequency sequentially and separately to demodulate the intermediate frequency signal to produce U- and V- signals.

13. A receiver according to claim 11 or 12, including means for dividing the output frequency of the crystal oscillator to derive said signal of sub-carrier frequency.

14. A receiver according to claim 12, including surface wave filter means having a flat amplitude response connected to provide suitable relative delays between the Y signal and the U- and V- signals.

15. A receiver according to claim 11, including gating means enabled to pass the intermediate frequency signal or a signal derived therefrom at appropriate times to produce the Y, U and V signals.

16. A receiver for colour television signals of the kind in which colour information is carried as phase dependent modulation of a sub-carrier signal, the receiver including a varactor controlled local oscillator, means for mixing a received video signal with a signal generated by said local oscillator to produce an intermediate frequency signal having a frequency which is a phase-locked integral multiple of said sub-carrier frequency; crystal controlled oscillator means; means responsive to a colour burst signal derived from said received video signal for locking the crystal controlled oscillator means to a multiple of the sub-carrier frequency; phase comparator means for comparing the output signal frequency of the crystal controlled oscillator means with said intermediate frequency signal; means responsive to an output signal from said comparator means for adjusting the frequency or phase of the local oscillator output signal in a sense to bring the intermediate frequency signal into said phase-locked relation with the output signal of said crystal controlled oscillator means; synchronous demodulator means for receiving said crystal controlled oscillator means output signal and said intermediate frequency signal for producing a Y or Y-chroma signal; and further demodulator means for utilizing the crystal controlled oscillator signal and a signal of sub-carrier frequency sequentially and separately to demodulate the intermediate frequency signal to produce U- and V- signals.

17. A receiver according to claim 16, including means for dividing the output frequency of said crystal controlled oscillator means to derive said signal of sub-carrier frequency.

18. A receiver according to claim 16, including surface wave filter means having a flat amplitude response connected to provide suitable relative delays between the Y- and the U- and V- signals.

* * * * *